United States Patent
Camarena Pulido et al.

(10) Patent No.: US 12,500,103 B2
(45) Date of Patent: Dec. 16, 2025

(54) CASSETTE MAGAZINE FOR THIN WAFERS

(71) Applicant: SKYWORKS SOLUTIONS, INC., Irvine, CA (US)

(72) Inventors: Leonardo Antonio Camarena Pulido, Mexicali (MX); Daniel Orozco Mariscal, Mexicali (MX); Miguel Angel Perez Arzola, Mexicali (MX)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 344 days.

(21) Appl. No.: 18/131,605

(22) Filed: Apr. 6, 2023

(65) Prior Publication Data
US 2023/0326774 A1 Oct. 12, 2023

Related U.S. Application Data

(60) Provisional application No. 63/362,832, filed on Apr. 12, 2022.

(51) Int. Cl.
*H01L 21/673* (2006.01)
*G01R 1/04* (2006.01)
(52) U.S. Cl.
CPC ........ *H01L 21/6732* (2013.01); *G01R 1/0491* (2013.01)

(58) Field of Classification Search
CPC ..... H01L 21/673; H01L 21/6732; G01R 1/04; G01R 1/0491; G01R 31/28; G01R 31/2867

See application file for complete search history.

(56) References Cited

U.S. PATENT DOCUMENTS

2005/0151549 A1* 7/2005 Okumura ........... G01R 31/2898 324/754.11

* cited by examiner

*Primary Examiner* — Son T Le
(74) *Attorney, Agent, or Firm* — Lando & Anastasi, LLP

(57) ABSTRACT

Aspects and embodiments disclosed herein include a cassette magazine for thin semiconductor wafers having thicknesses of about 100 μm and diameters of 200 mm. The cassette magazine includes a plurality of slot supports configured to support sides of the thin semiconductor wafers. The plurality of slot supports have widths that provide sufficient support for the thin semiconductor wafers when disposed in the cassette magazine such that centers of the thin semiconductor wafers sag by less than about 0.3 cm. The cassette magazine includes first and second sidewalls coupled together by one or more rods or plates. The plurality of slot supports extend inward from both the first sidewall and the second sidewall.

5 Claims, 9 Drawing Sheets

THIN SEMICONDUCTOR WAFERS
WITH REDUCED SAG

CASSETTE MAGAZINE FOR THIN WAFERS

CROSS-REFERENCE TO RELATED APPLICATIONS

This application claims priority under 35 U.S.C. § 119(e) to U.S. Provisional Patent Application Ser. No. 63/362,832, titled "CASSETTE MAGAZINE FOR THIN WAFERS," filed Apr. 12, 2022, the entire content of which is incorporated herein by reference for all purposes.

BACKGROUND

Technical Field

Embodiments of this disclosure relate to cassette magazines for carrying thin semiconductor wafers, and in particular, for cassette magazines for supporting thin semiconductor wafers during electrical testing of devices formed on the semiconductor wafers.

Description of Related Technology

In modern semiconductor manufacturing hundreds if not thousands of individual semiconductor chips or die may be formed on a single semiconductor wafer. After completion of fabricating the semiconductor die, the die may be electrically tested to determine which die are functional and meet specifications and should proceed to packaging, and which die are defective and should be scrapped. Electrical testing is typically performed on the individual die prior to singulation and so electrical testing equipment typically handles entire wafers. The wafers may be disposed in a carrier, referred to as a wafer cassette magazine or "boat," from which a robot arm of the electrical testing equipment retrieves individual wafers for testing and then returns the wafer to the wafer cassette magazine.

SUMMARY

In accordance with one aspect, there is provided a cassette magazine for thin semiconductor wafers. The cassette magazine comprises first and second sidewalls, one or more rods or plates coupling the first and second sidewalls to one another, and a plurality of slot supports configured to support sides of the thin semiconductor wafers extending inward from both the first sidewall and the second sidewall, the plurality of slot supports having widths sufficient to cause a distance by which centers of the thin semiconductor wafers sag to be less than about 0.3 cm when the thin semiconductor wafers have thicknesses of about 100 µm and diameters of 200 mm.

In some embodiments, the plurality of slot supports have widths of about 45.3 mm.

In some embodiments, the plurality of slot supports include tapered front edges.

In some embodiments, the plurality of slot supports include front edges with outer portions extending normal to a plane defined by inner surfaces of the first and second sidewalls, and inner portions that are tapered in a direction toward a rear of the cassette magazine from the outer portions.

In some embodiments, the inner portions of the slot supports are tapered at an angle of about 45° relative to the outer portions.

In some embodiments, the first and second sidewalls include front edges, rear edges, upper edges, and lower edges, wafer stop rods extend from proximate the upper edge to proximate the lower edge of each of the first and second sidewalls, and the slot supports have front edges proximate the front edges of the first and second sidewalls and the slot supports extend rearwardly into an interior volume of the cassette magazine and terminate at the wafer stop rods.

In accordance with another aspect, there is provided a method comprising mounting semiconductor wafers having thicknesses of about 100 µm into a cassette magazine including first and second sidewalls, one or more rods or plates coupling the first and second sidewalls to one another, and a plurality of slot supports configured to support sides of the thin semiconductor wafers extending inward from both the first sidewall and the second sidewall, the plurality of slot supports having widths sufficient to cause a distance by which centers of the thin semiconductor wafers sag to be less than about 0.3 cm when the thin semiconductor wafers have thicknesses of about 100 µm and diameters of 200 mm, placing the cassette magazine including the semiconductor wafers on a stage of an electrical tester for electrically testing die on the semiconductor wafers, causing the electrical tester to run an electrical testing routine on the die, and removing the cassette magazine including the semiconductor wafers from the stage of the electrical tester after completion of the electrical testing routine.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
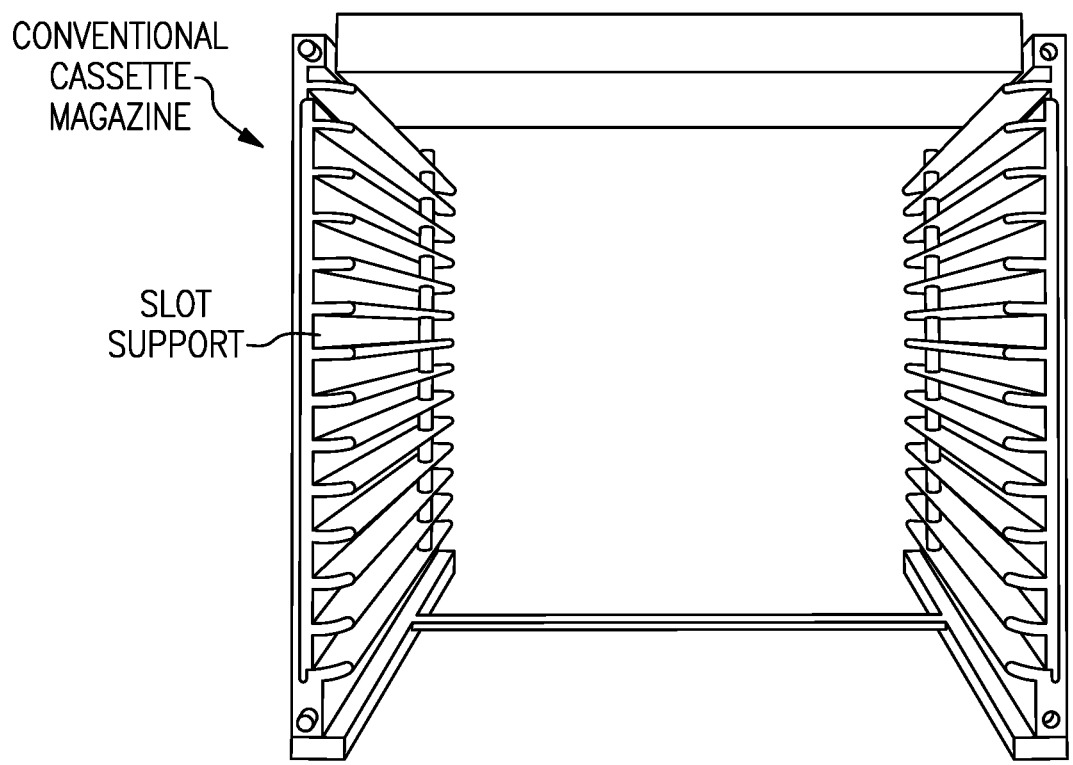
FIG. 1A is an elevational view of a conventional cassette magazine.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects and embodiments disclosed herein are generally directed to cassette magazines for carrying thin semiconductor wafers and for providing the thin wafers for retrieval and replacement by a robot of an electrical die tester.

As consumers continue to demand additional functionality and small form factors, for example, thickness, in modern consumer electronics such as cellular telephones, manufacturers strive to reduce the size of the semiconductor die used in such electronic devices so that sufficient die may be included in a device of a particular form factor to provide the functionality desired. One way to provide die that will fit within an electronic device of a particular thickness is to reduce the thickness of the die themselves and associated packaging. After completion of fabrication of die on a semiconductor wafer, for example, a silicon, gallium arsenide, or other semiconductor wafer, the wafer may be thinned by back grinding prior to sending the completed wafer for testing, singulation, and packaging of the individual semiconductor die. In one example, semiconductor wafers that were once thinned to about 30 mil after completion of fabrication of the die on the wafer are now thinned to about 4 mil (about 100 µm). At this thickness, the semiconductor wafer loses much of its rigidity and becomes difficult to handle.

Figure 1B:
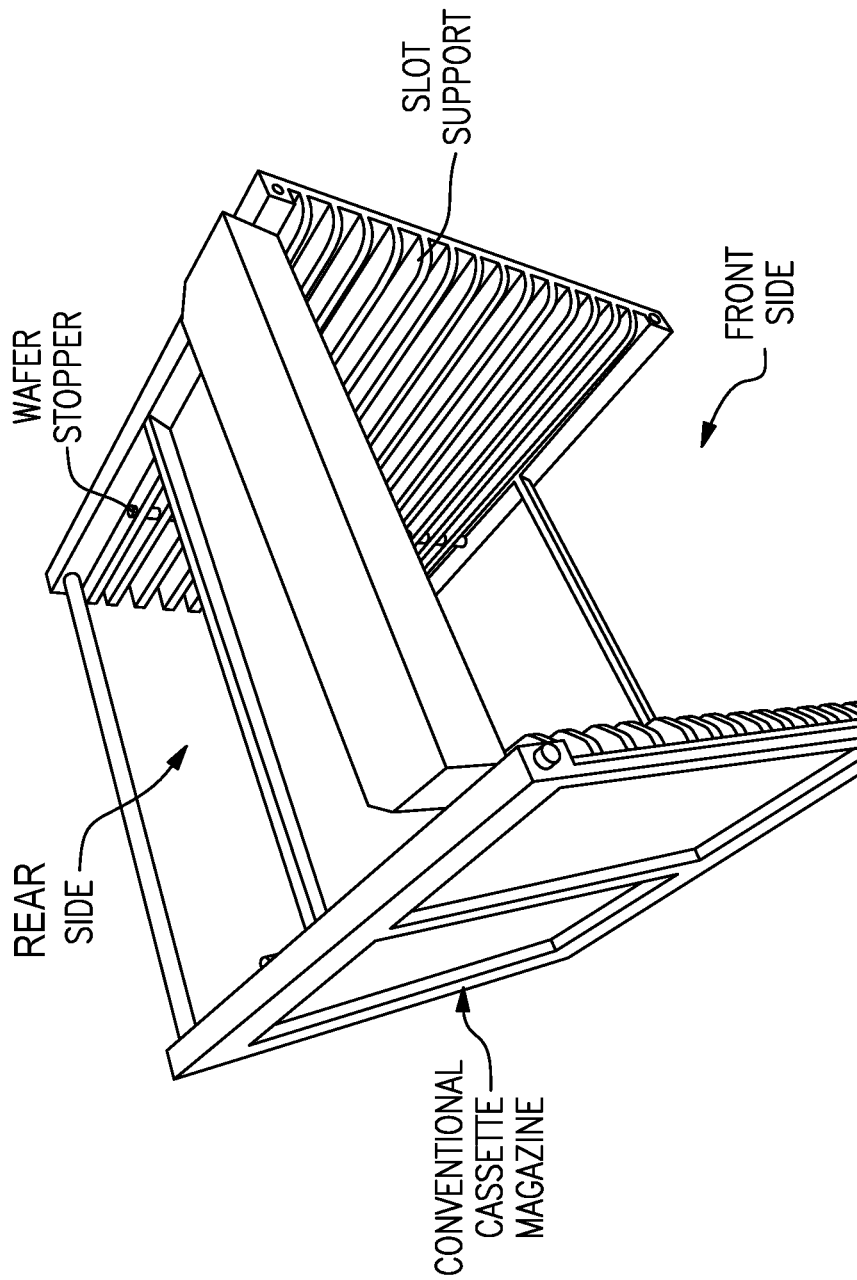
FIG. 1B is an isometric view from above of the conventional cassette magazine of FIG. 1A.

For loading onto an electrical test apparatus, semiconductor wafers are typically placed into a cassette magazine from which a robot arm of the electrical test apparatus may retrieve the wafers for testing of the individual die on the wafers and to which the robot may return the wafers to after testing of the die. With the conversion to thinner, less rigid wafers as discussed above, the wafers may exhibit a noticeable sag or downward bow while mounted in the cassette magazine. FIG. 1A is an elevational view of a conventional cassette magazine. FIG. 1B is an isometric view of the conventional cassette magazine. The conventional cassette magazine includes first and second sidewalls coupled to one another by rods and a plate and has slot supports for supporting semiconductor wafers extending inward from interior sides of the sidewalls.

Figure 2A:
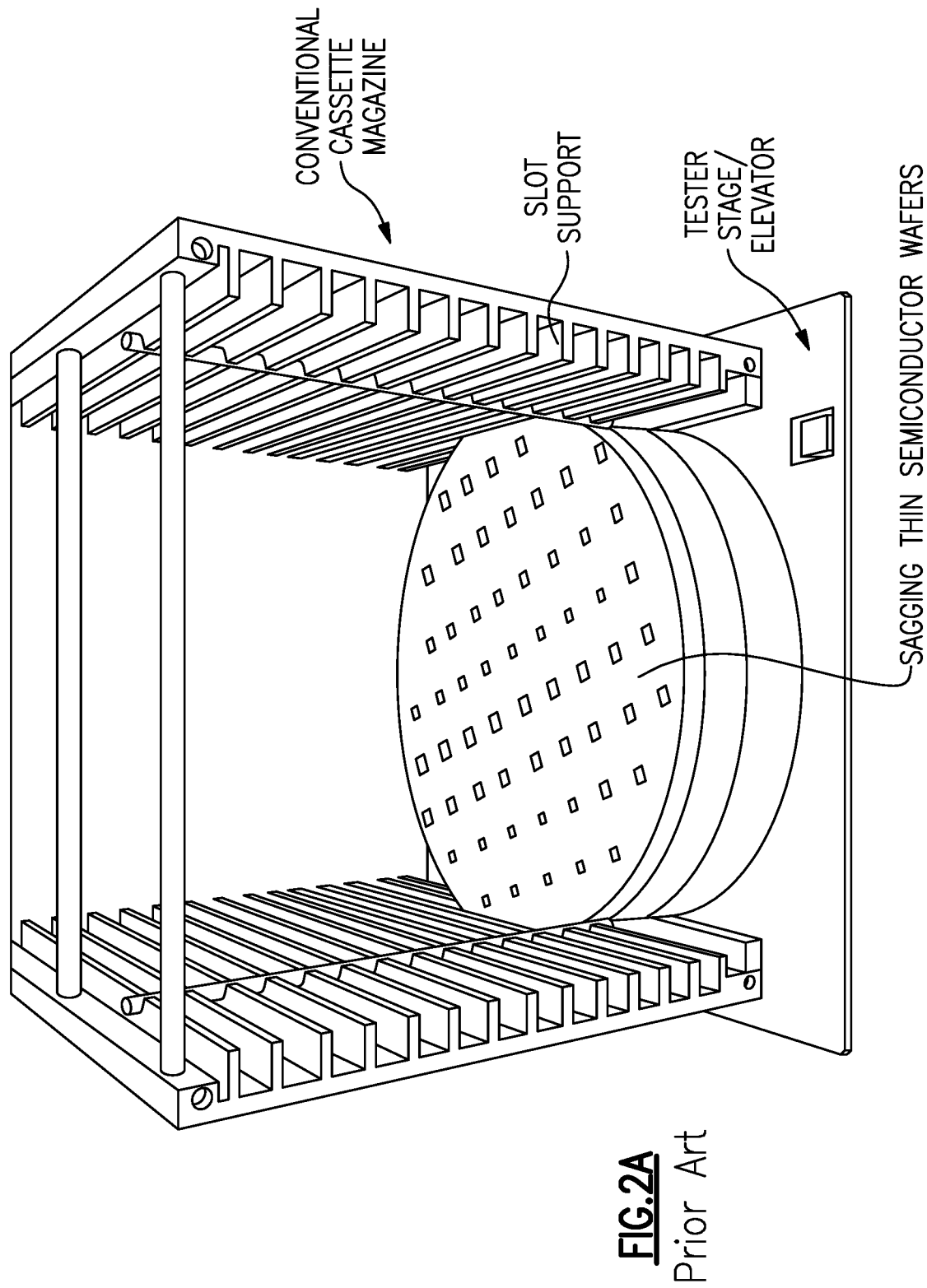
FIG. 2A is an isometric view from above of thin semiconductor wafers mounted in an example of a conventional cassette magazine.
Figure 2B:
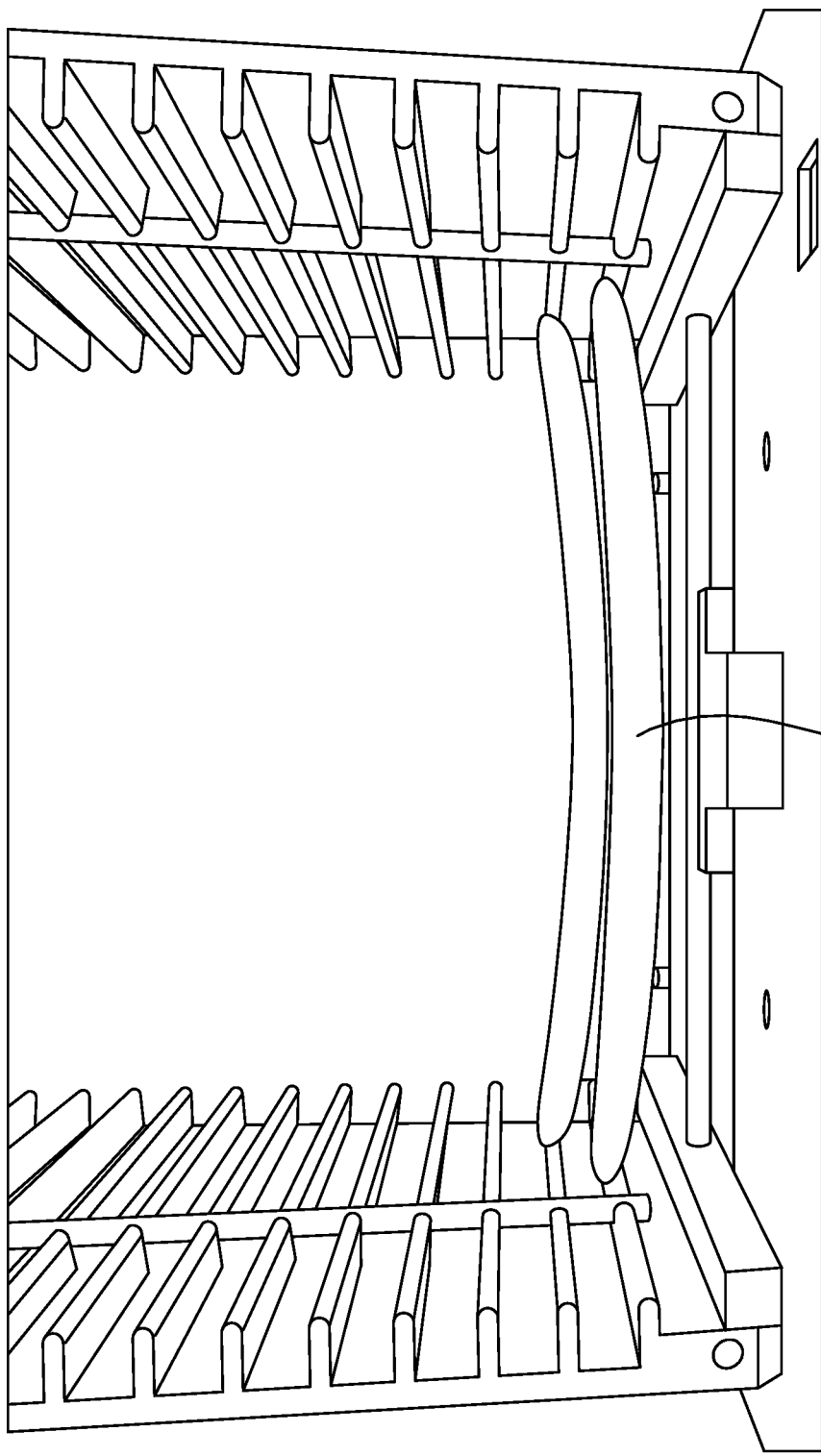
FIG. 2B is an elevational view of thin semiconductor wafers mounted in an example of a conventional cassette magazine.
Figure 2C:
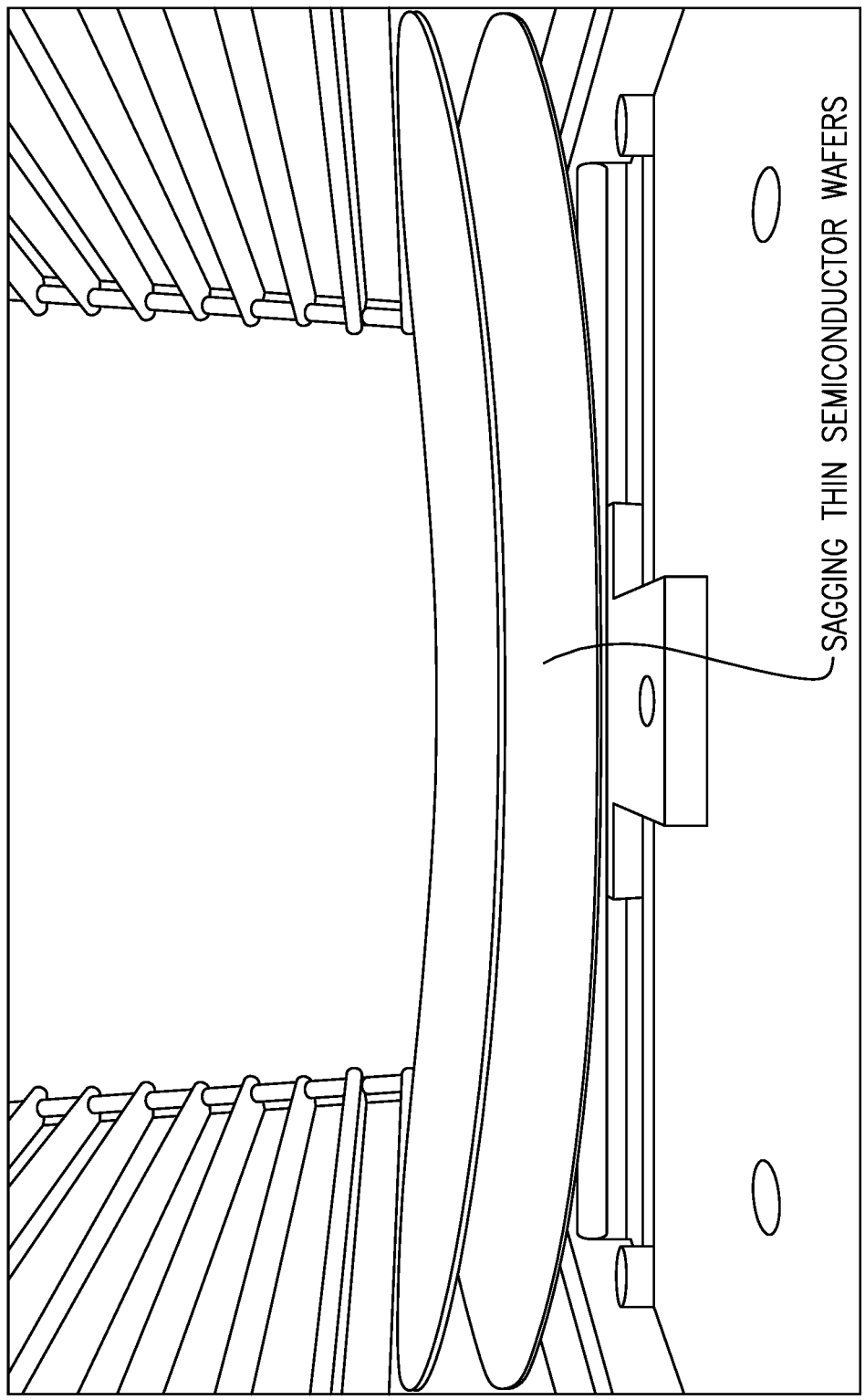
FIG. 2C is an enlarged elevational view of thin semiconductor wafers mounted in an example of a conventional cassette magazine.

FIG. 2A illustrates thin (about 100 µm thick, 8 inch (200 mm) diameter) semiconductor wafers mounted in a conventional cassette magazine on the stage of an electrical tester. FIG. 2B is a view from a direction close to edge-on of two wafers mounted in the cassette shown in FIG. 2A. FIG. 2C is a close-up view of the wafers in the conventional cassette magazine. As can be observed, the centers of the wafers droop or sag downward by about 9 mm from the slot supports on which the sides of the wafers are supported at the sides of the magazine. The slot supports of the conventional cassette magazine are about 0.5 inches (about 12.7 mm) across and do not adequately support the thin 200 mm diameter wafers from the sides. This amount of deformation of the wafers may lead to wafer breakage as the robot arm of the electrical tester collides with the sagging central regions of the wafers when attempting to retrieve a wafer to bring into the tester or when replacing a wafer into the magazine. The amount of wafer sag exhibited by the thin wafers in the conventional cassette magazine also leads to identification errors where the electrical tester cannot identify the presence of wafers in the magazine because the centers of the wafers are not where the electrical tester looks to determine if wafers are present or not.

Figure 3A:
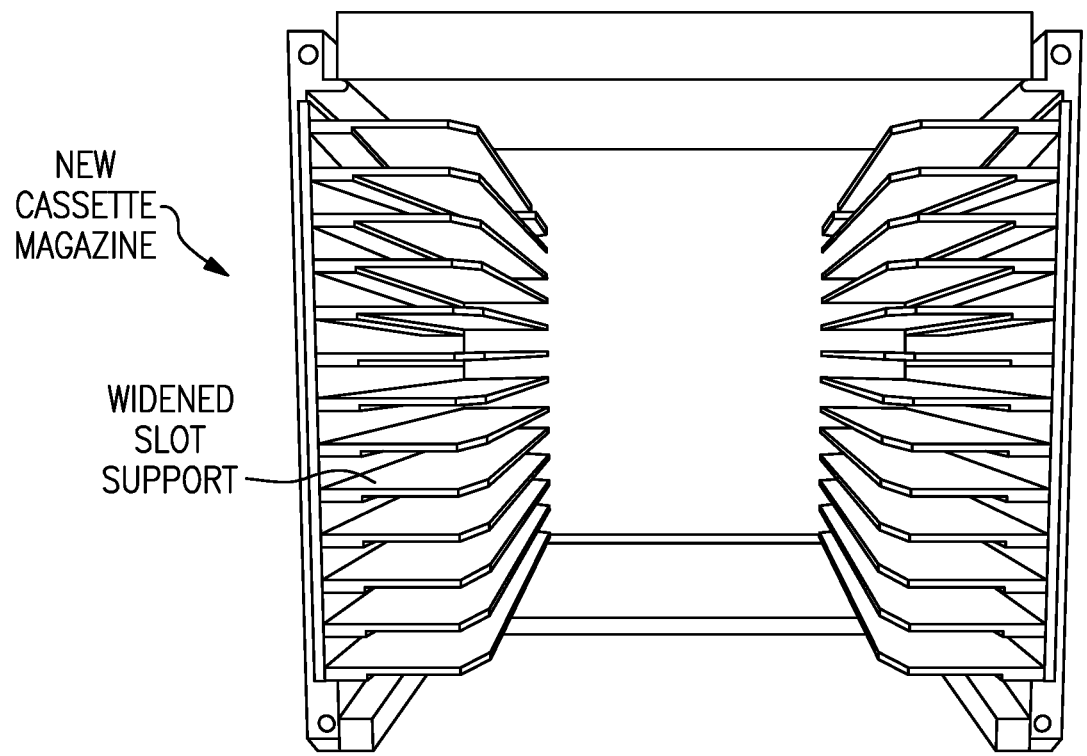
FIG. 3A is an elevational view of an improved cassette magazine in accordance with an embodiment disclosed herein.
Figure 3B:
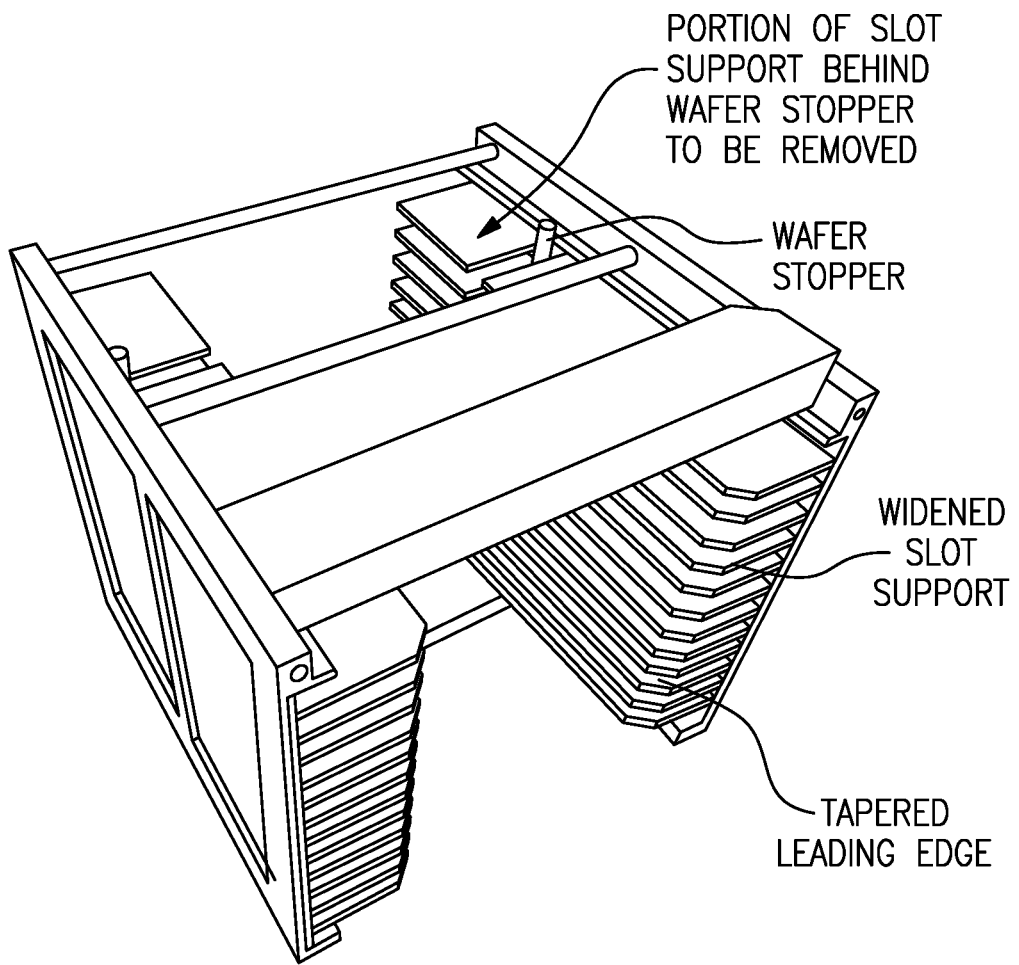
FIG. 3B is an isometric view from above of the cassette magazine of FIG. 3A.

To address the problem of excess thin wafer sag in a cassette magazine, a new cassette magazine was developed. The new cassette magazine is illustrated in elevational view in FIG. 3A and in an isometric view from above in FIG. 3B. The new cassette magazine has significantly wider slot supports than the conventional cassette magazine, for example, about 1.785 inches (about 45.3 mm) across. The width of the slot supports is limited by the clearance needed between the slot supports for the robot arm of an electrical tester to reach in between the slot supports to retrieve or replace a wafer from the cassette magazine. To help the robot arm of an electrical tester to reach between the slot supports without impact, inner portions of leading edges of the slot supports may be tapered, for example, by about 45° relative to the outer portions of the front edges of the slot supports and to the lengthwise inner edges of the slot supports that are perpendicular to the outer portions of the front edges of the slot supports. In other embodiments, the entireties of the front edges of the slot supports may be tapered. To save weight, portions of the enlarged slot supports behind the wafer stopper rod (See FIG. 3B) may be removed as the wafers are not supported by this portion of the slot supports.

In some embodiments the cassette magazines may be formed from a metal, for example, 6061-T6 Hard anodized Class III aluminum, stainless steel, another metal or metals, or from an engineering plastic. The wafer stopper rods would generally be formed from a plastic material.

Figure 4A:
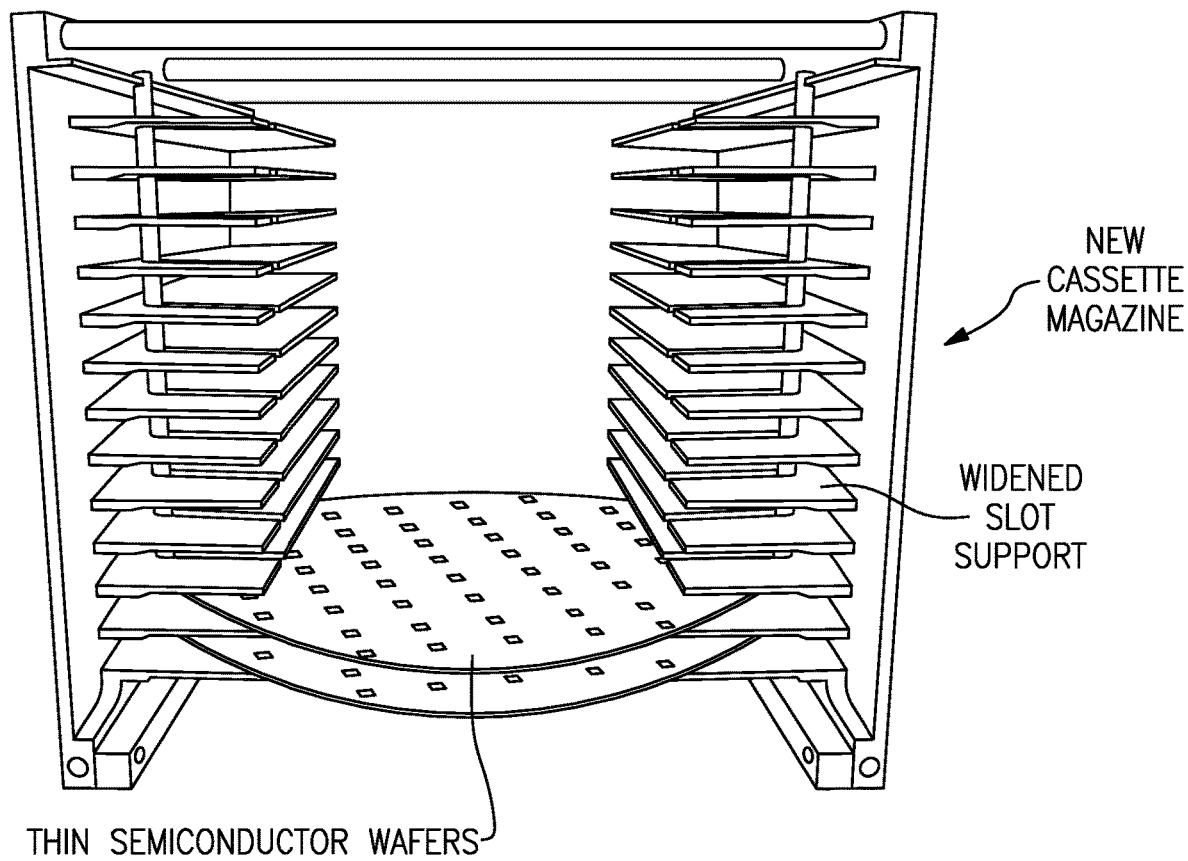
FIG. 4A is an isometric view from above of thin semiconductor wafers mounted in an example of an improved cassette magazine.
Figure 4B:
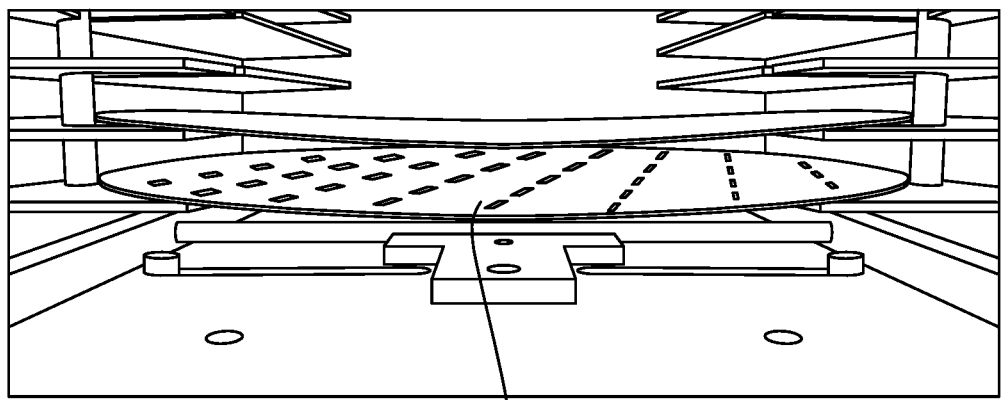
FIG. 4B is an elevational view of thin semiconductor wafers mounted in an example of an improved cassette magazine.

A view of the same type of thin semiconductor wafers illustrated in the conventional magazine cassette in FIGS. 2A-2C are illustrated mounted in an example of the new cassette magazine in FIG. 4A and FIG. 4B, with FIG. 4B being a close-up edge-on view of the thin semiconductor wafers in the new cassette magazine. As can be seen from a comparison between FIG. 4B and FIG. 2C, the wafers sag significantly less (about three times less) when mounted in the new cassette magazine design than in the conventional cassette magazine. The amount of sag at the center of the wafers in the new cassette magazine design may be less than about 3 mm. Testing to date with the new cassette magazines has eliminated instances of wafer breakage and instances of undetected wafers on the electrical testers.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A cassette magazine for thin semiconductor wafers comprising:
   first and second sidewalls;
   one or more rods or plates coupling the first and second sidewalls to one another; and
   a plurality of slot supports configured to support sides of the thin semiconductor wafers extending inward from both the first sidewall and the second sidewall, the plurality of slot supports including front edges with outer portions extending normal to a plane defined by inner surfaces of the first and second sidewalls, and inner portions that are tapered in a direction toward a rear of the cassette magazine from the outer portions.

2. The cassette magazine of claim 1 wherein the plurality of slot supports have widths of 45.3 mm.

3. The cassette magazine of claim 1 wherein the inner portions of the slot supports are tapered at an angle of 45° relative to the outer portions.

4. The cassette magazine of claim 1 wherein the first and second sidewalls include front edges, rear edges, upper edges, and lower edges, wafer stop rods extend from proximate the upper edge to proximate the lower edge of each of the first and second sidewalls, the slot supports have front edges proximate the front edges of the first and second sidewalls, and the slot supports extend rearwardly into an interior volume of the cassette magazine and terminate at the wafer stop rods.

5. A method comprising:
   mounting semiconductor wafers into a cassette magazine including first and second sidewalls, one or more rods or plates coupling the first and second sidewalls to one another, and a plurality of slot supports configured to support sides of the semiconductor wafers extending inward from both the first sidewall and the second sidewall, the plurality of slot supports including front edges with outer portions extending normal to a plane defined by inner surfaces of the first and second sidewalls, and inner portions that are tapered in a direction toward a rear of the cassette magazine from the outer portions;
   placing the cassette magazine including the semiconductor wafers on a stage of an electrical tester for electrically testing die on the semiconductor wafers;
   causing the electrical tester to run an electrical testing routine on the die; and
   removing the cassette magazine including the semiconductor wafers from the stage of the electrical tester after completion of the electrical testing routine.

\* \* \* \* \*